United States Patent
Jin et al.

(10) Patent No.: US 9,634,659 B2
(45) Date of Patent: Apr. 25, 2017

(54) VOLTAGE CONTROLLER FOR RADIO-FREQUENCY SWITCH

(71) Applicant: Taiwan Semiconductor Manufacturing Company Limited, Hsin-Chu (TW)

(72) Inventors: Jun-De Jin, Hsinchu (TW); Tzu-Jin Yeh, Hsinchu (TW); Chewn-Pu Jou, Chutung (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/972,217

(22) Filed: Aug. 21, 2013

(65) Prior Publication Data

US 2014/0266419 A1    Sep. 18, 2014

Related U.S. Application Data

(60) Provisional application No. 61/799,390, filed on Mar. 15, 2013.

(51) Int. Cl.
| | | |
|---|---|---|
| H02H 9/04 | (2006.01) | |
| H03K 17/687 | (2006.01) | |
| H01L 27/02 | (2006.01) | |
| H03K 17/693 | (2006.01) | |

(52) U.S. Cl.
CPC ..... *H03K 17/6871* (2013.01); *H01L 27/0266* (2013.01); *H02H 9/041* (2013.01); *H02H 9/043* (2013.01); *H02H 9/046* (2013.01); *H03K 17/693* (2013.01)

(58) Field of Classification Search
CPC ..... H01L 27/0266; H02H 9/046; H02H 9/043
USPC ....... 327/581, 538, 540, 541, 543, 594, 595, 327/77, 78, 80, 81, 309, 310, 312, 327, 327/328; 361/88, 90, 91.1, 91.2
See application file for complete search history.

(56) References Cited

U.S. PATENT DOCUMENTS

| | | | |
|---|---|---|---|
| 6,804,502 B2* | 10/2004 | Burgener et al. ............. | 455/333 |
| 2004/0152426 A1* | 8/2004 | Suzuki ..................... | H04B 1/48 455/83 |
| 2009/0268360 A1* | 10/2009 | Shinomiya et al. ........... | 361/56 |

FOREIGN PATENT DOCUMENTS

CN    1503591 A    6/2004

* cited by examiner

*Primary Examiner* — Jung Kim
(74) *Attorney, Agent, or Firm* — Cooper Legal Group, LLC

(57) ABSTRACT

One or more systems and techniques for limiting a voltage potential between an antenna and a radio-frequency switch circuit are provided. A voltage controller comprises a voltage generator, a voltage detection circuit and a switch cell. The voltage detection circuit is coupled to the voltage generator and to the switch cell, and the switch cell is coupled to a voltage source, and to a node between the radio-frequency switch circuit and the antenna. When the voltage potential exceeds a specified threshold, the voltage generator produces a voltage which the voltage detection circuit measures such that the voltage detection circuit activates the switch cell, resulting in a short circuit between the radio-frequency switch circuit and the voltage source. This serves to inhibit the voltage potential from exceeding the specified threshold, for example.

20 Claims, 4 Drawing Sheets

VOLTAGE CONTROLLER FOR RADIO-FREQUENCY SWITCH

RELATED APPLICATION

This application is a continuation of U.S. Provisional Patent Application No. 61/799,390, filed on Mar. 15, 2013 and entitled "VOLTAGE CONTROLLER FOR RADIO-FREQUENCY SWITCH," which is incorporated herein.

BACKGROUND

Radio-frequency switches are commonly found in, among other things, wireless communication devices. Such switches are configured to facilitate coupling various circuits of a wireless communication device to an antenna. For example, it is, at times, desirable to couple a first set of circuits to the antenna when receiving information through the antenna and to couple a second set of circuits to the antenna when transmitting information. As another example, it is, at times, desirable to couple a first set of circuits to the antenna when communicating via a first communication scheme and to couple a second set of circuits to the antenna when communicating via a second communication scheme.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

According to some embodiments, a voltage controller for controlling a voltage potential between an antenna and a radio-frequency switch circuit is provided. The voltage controller is configured to monitor the voltage potential. When the voltage controller determines that the voltage potential exceeds a specified threshold, the voltage controller is configured to activate a switch cell. Activation of the switch cell is configured to couple a voltage source to the radio-frequency switch circuit and to reduce the voltage potential. In some embodiments, the voltage source is ground. In such an embodiment, when the voltage potential exceeds the specified threshold, the switch cell grounds the radio-frequency switch circuit to reduce the voltage potential between the antenna and the radio-frequency switch circuit. In this way, the voltage applied to the radio-frequency switch circuit does not exceed a voltage that the radio-frequency switch circuit is configured to support.

In some embodiments, an increase in voltage potential is caused by an antenna disconnect, where the antenna becomes physically disconnected from an antenna port. In some embodiments, the voltage controller is configured to identify an antenna disconnect, based upon the voltage potential, and to activate the switch cell when the antenna becomes disconnected.

The following description and annexed drawings set forth certain illustrative aspects and implementations. These are indicative of but a few of the various ways in which one or more aspects are employed. Other aspects, advantages, and novel features of the disclosure will become apparent from the following detailed description when considered in conjunction with the annexed drawings.

DETAILED DESCRIPTION

Figure 1:
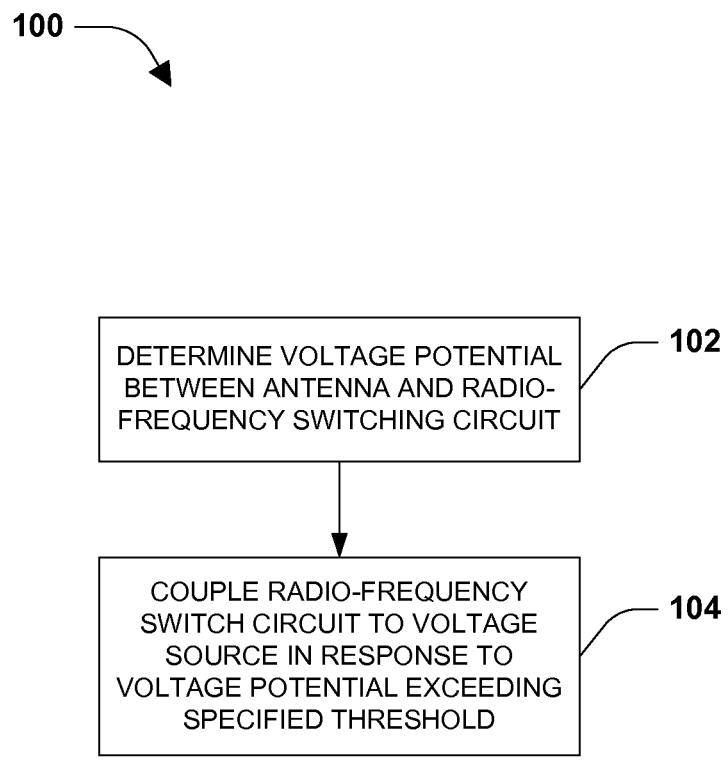
FIG. 1 is a flow diagram illustrating a method of inhibiting a voltage potential from exceeding a specified threshold.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

In some embodiments, an apparatus for a wireless communication device is provided. The apparatus comprises a radio-frequency switch circuit configured to route one or more signals between an antenna, or an antenna port to which the antenna is coupled, and other circuitry of the wireless communication device. The apparatus also comprises a voltage controller configured to monitor a voltage potential between the radio-frequency switch circuit and the antenna.

In some embodiments, the voltage controller is configured to identify an antenna disconnect based upon the voltage potential. By way of example, if the voltage potential exceeds a specified threshold, the voltage controller is configured to determine that an antenna disconnect occurred and to couple the radio-frequency switch circuit to a voltage source. In some embodiments, the voltage source is ground. This method is configured to mitigate damage to the radio-frequency switch circuit caused by the antenna disconnect and a voltage increase resulting therefrom.

In some embodiments, the voltage controller comprises a voltage detection circuit for determining a voltage potential between the antenna and the radio-frequency switch circuit. In some embodiments, the voltage controller comprises a switch cell configured to reduce the voltage potential by applying the voltage potential to the voltage source, such as ground, when the voltage potential exceeds the specified threshold.

In some embodiments, the switch cell comprises an arrangement of one or more transistors, such as a series arrangement of two or more transistors. In some embodiments, at least some of the transistors are p-type transistors, such as p-type MOSFETs. In some embodiments, at least some of the transistors are n-type transistors, such as n-type MOSFETs. In some embodiments, the switch cell is comprised of 6 n-type MOSFETs arranged in series.

In some embodiments, the radio-frequency switch circuit comprises one or more switch cells, and the switch cell of the voltage controller is arranged similar to at least one switch cells of the radio-frequency switch circuit. In some embodiments, switch cells of the radio-frequency switch circuit comprise a series arrangement of 6 n-type MOSFETS and the switch cell of the voltage controller comprises a series arrangement of 6 n-type MOSFETS. In this way, the switch cell of the voltage controller is configured to support a voltage that is substantially equal to a voltage supported by switch cells of the radio-frequency switch circuit.

In some embodiments, the voltage controller comprises a plurality of switch cells.

In some embodiments, the voltage detection circuit of the voltage controller is configured to activate the switch cell. In some embodiments, the voltage detection circuit is coupled to gates of the one or more transistors of the switch cell. When the voltage detection circuit determines that the voltage potential exceeds the specified threshold, the voltage detection circuit applies a voltage to respective gates that is configured to activate the gates, causing the switch cell to form a short-circuit. When the voltage detection circuit determines that the voltage potential is less than or equal to the specified threshold, the voltage detection circuit applies a voltage to respective gates that is configured to deactivate the gates, causing the switch cell to form an open-circuit, according to some embodiments.

In some embodiments, the voltage controller comprises a reference voltage generator, such as a voltage divider, configured to generate a reference voltage based upon the detected voltage potential between the antenna and the radio-frequency switch circuit. In some embodiments, the reference voltage is applied to the voltage detection circuit and the voltage detection circuit is configured to determine whether the voltage potential exceeds the specified threshold based upon the reference voltage.

In some embodiments, the specified threshold is set to be a voltage substantially equal to a voltage that the radio-frequency switch circuit is configured to support, within a desired safety margin. By way of example, for GSM cellular devices, the power to an antenna to which the radio-frequency switch circuit is coupled is typically 2 watts. 2 watts is substantially equal to 14.1 volts. Accordingly, in some embodiments, the radio-frequency switch circuit is configured to support a voltage of about 15 volts. In some embodiments, respective switch cells of the radio-frequency switch circuit comprise six n-type MOSFETs which respectively have a voltage rating of 2.5 volts, for a total voltage rating of 15 volts. A voltage that exceeds 15 volts is potentially damaging to the radio-frequency switch circuit. Thus, in some embodiments, the specified threshold is set to be more than 14.1 volts and less than or equal to 15 volts. In this way, when a voltage potential of over 15 volts is detected by the voltage detection circuit, the voltage controller grounds the radio-frequency switch circuit, to mitigate damage to the radio-frequency switch circuit, for example.

A method 100 of inhibiting a voltage potential from exceeding a specified threshold, according to some embodiments, is illustrated in FIG. 1. In some embodiments, such method 100 finds applicability in inhibiting a voltage potential between an antenna and a radio-frequency switch circuit, configured to route one or more signals between the antenna and other circuitry of a wireless communication device, from exceeding a specified threshold. In some embodiments, the specified threshold is a voltage threshold that exceeds a recommended voltage of one or more switch cells of the radio-frequency switch circuit.

At 102 in the method 100, a voltage potential between an antenna and a radio-frequency switch circuit is determined. In some embodiments, determining the voltage potential at 102 comprises sensing whether the voltage potential exceeds the specified threshold. In some embodiments, determining the voltage potential at 102 comprises measuring the voltage potential at a radio-frequency common node 202 in FIG. 2 between the antenna, or an antenna port to which the antenna is coupled, and the radio-frequency switch circuit.

At 104 in the method 100, the radio-frequency switch circuit is coupled to a voltage source in response to the voltage potential between the antenna and the radio-frequency switch circuit exceeding the specified threshold. In some embodiments, the voltage source is ground and thus the radio-frequency switch circuit becomes grounded when the voltage potential exceeds the specified threshold, such as occurs when the antenna becomes disconnected. In some embodiments, the voltage source is configured to generate a voltage that is less that the specified threshold to reduce the voltage potential between the antenna and the radio-frequency switch circuit.

Figure 2:
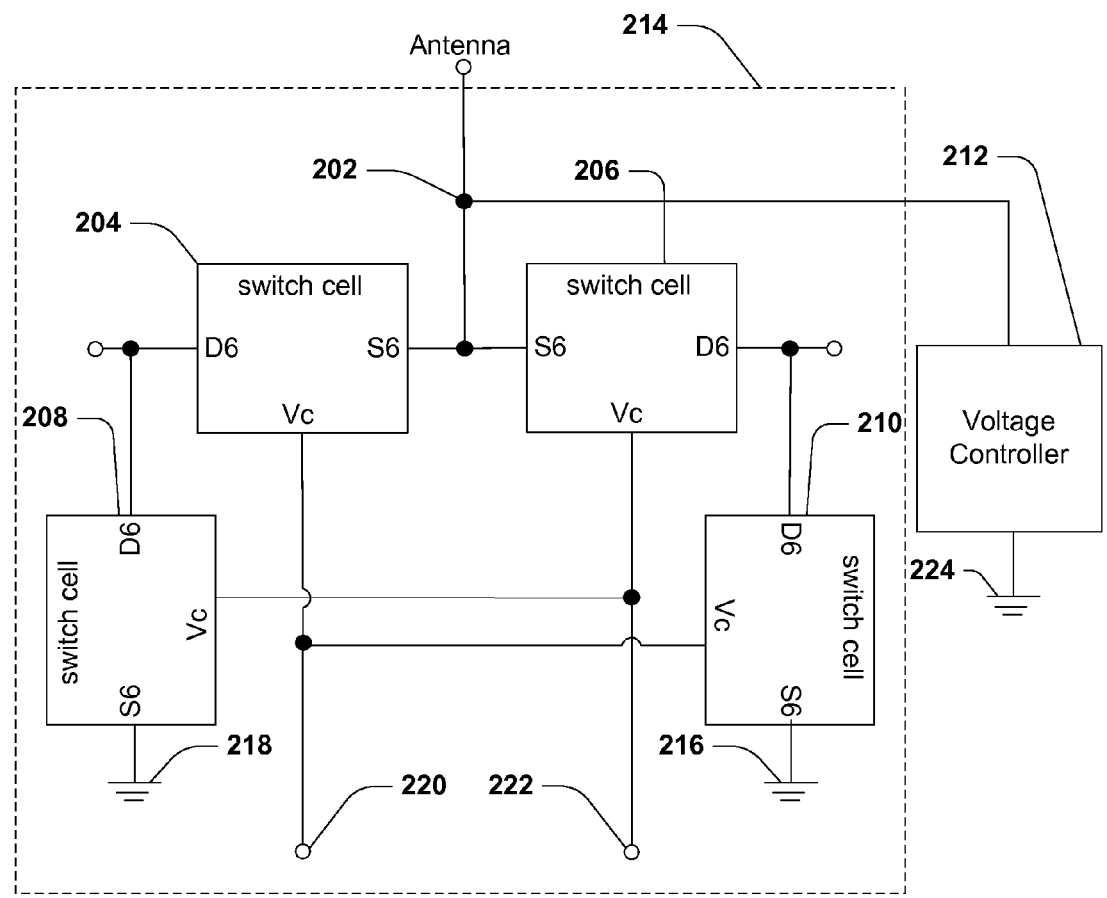
FIG. 2 is an illustration of a circuit, according to some embodiments.

FIG. 2 illustrates a radio-frequency switch circuit 214 in accordance with various embodiments of the present disclosure. The radio-frequency switch circuit 214 is coupled to a voltage controller 212 and comprises four switch cells, 204, 206, 208 and 210. In some embodiments, the radio-frequency switch circuit 214 comprises fewer than four switch cells. In some embodiments, the radio-frequency switch circuit 214 comprises more than four switch cells. The voltage controller 212 is coupled to the radio-frequency common node 202.

A first terminal S6 of the switch cell 204 and a first terminal of the switch cell 206 are respectively coupled to the radio-frequency common node 202 to which an antenna is connected. A second terminal D6 of the switch cell 206 is coupled to a first terminal D6 of the switch cell 210, and a second terminal S6 of the switch cell 210 is coupled to a first voltage source 216. A second terminal D6 of the switch cell 204 is coupled to a first terminal D6 of the switch cell 208, and a second terminal S6 of the switch cell 208 is coupled to a second voltage source 218. In some embodiments, at least one of the first voltage source 216 and/or the second voltage source 218 are ground.

A third terminal $V_c$ of the switch cell 204 and a third terminal $V_c$ of the switch cell 210 are coupled, via a first terminal 220, to a third voltage source configured to apply a third voltage to the third terminal $V_c$ of the switch cell 204 and the third terminal $V_c$ of the switch cell 210. A third terminal $V_c$ of the switch cell 206 and a third terminal $V_c$ of the switch cell 208 are coupled, via a second terminal 222, to a fourth voltage source configured to apply a fourth voltage to the third terminal $V_c$ of the switch cell 206 and the third terminal $V_c$ of the switch cell 208. In some embodiments, the fourth voltage is an inverse of the third voltage.

In some embodiments, respective switch cells 204, 206, 208, and 210 comprise one or more switching elements. Such switching elements comprise one or more suitable electronic switches, such as insulated gate bipolar transistors (IGBTs), bipolar junction transistors (BJTs), field-effect transistors (FETs), metal-oxide semiconductor field-effect transistors (MOSFETs), gate turnoff thyristors (GTOs), integrated gate-commutated thyristors (IGCTs), bidirectional triode thyristors (TRIACs), etc., for example. By way of example, as further described with respect to FIG. 4 of the instant application, respective switch cells 204, 206, 208, and 210 comprise a series arrangement of transistors. A source of a first transistor of the series arrangement is coupled to one terminal of the switch cell, and a drain of a last transistor of the series arrangement is coupled to another terminal of the switch cell. Gates of respective transistors of the series arrangement are coupled to yet another terminal of the switch cell. The source of the first transistor of the series arrangement is coupled to the terminal labeled S6 and the drain of the last transistor of the series arrangement is coupled to the terminal labeled D6. Gates of respective transistors of the series arrangement are coupled to the terminal labeled $V_c$.

In some embodiments, to control a voltage potential between the antenna and the switch cells 204, 206, 208, and 210, a voltage controller 212 is coupled to the radio-frequency common node 202. The voltage controller 212 is configured to measure a voltage potential at the radio-frequency common node 202. If the voltage exceeds a specified threshold, the voltage controller 212 is configured to couple the radio-frequency common node 202 to a fifth voltage source 224. In some embodiments, the fifth voltage source 224 is ground. In this way, in some embodiments, the voltage potential at the radio-frequency common node 202 is inhibited from exceeding a voltage which could damage the radio-frequency switch circuit 214 or aspects thereof such as one or more switch cells 204, 206, 208, 210.

Figure 3:
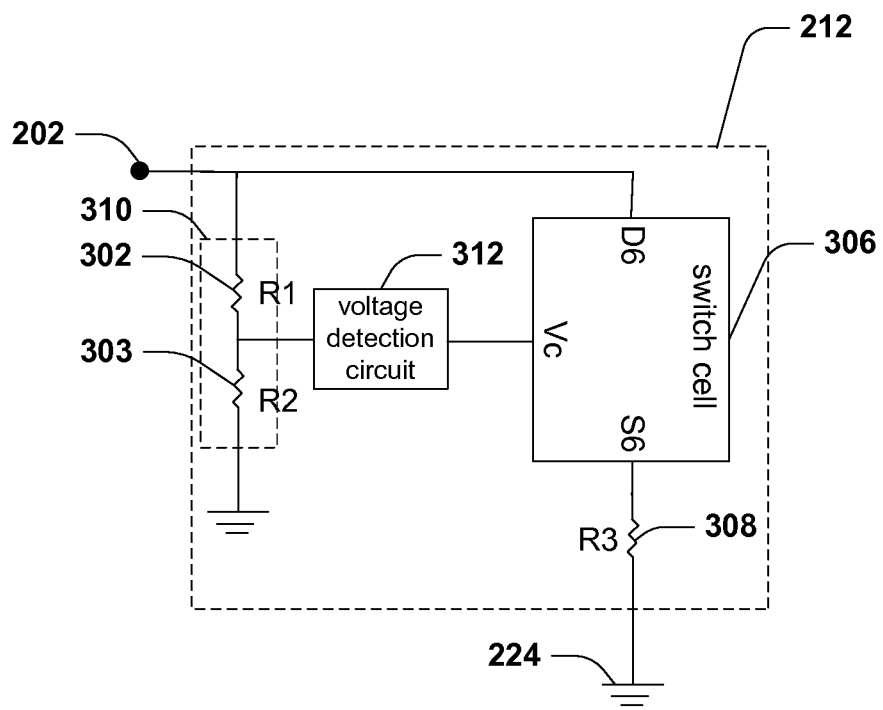
FIG. 3 is an illustration of a circuit, according to some embodiments.

FIG. 3 illustrates a voltage controller 212 in accordance with various embodiments of the present disclosure. The voltage controller 212 comprises a reference voltage generator 310, a voltage detection circuit 312, a switch cell 306, and a resistor 308.

In some embodiments, the voltage generator 310 is configured to generate a reference voltage based upon the voltage potential at the radio-frequency common node 202. In some embodiments, the voltage generator 310 is a voltage-divider configured to generate a reference voltage which is proportional to the voltage potential at the radio-frequency common node 202. For example, the voltage generator 310 comprises a first resistor 302 and a second resistor 304. In some embodiments, the ratio of a value of the first resistor 302 to a value of the second resistor 304 is about 100 to 1. Accordingly, the voltage reference will be $1/100^{th}$ of the voltage potential at the radio-frequency common node 202. By way of example, if the first resistor 302 is about 10 kilo-ohms and the second resistor 304 is about 100 ohms, the reference voltage will be about 0.15 volts when the voltage potential at the radio-frequency common node 202 is about 15 volts ((100/(10000+100))*15).

The voltage detection circuit 312 is configured to determine a voltage potential at the radio-frequency common node 202, and thus between the antenna and a switch cell 204, 206, 208, 210, using the reference voltage. By way of example, the voltage detection circuit is configured to measure the reference voltage to determine whether the voltage potential at the radio-frequency common node 202 exceeds the specified threshold. When the reference voltage exceeds a second specified threshold, thus indicating that the voltage potential at the radio-frequency common node 202 exceeds the specified threshold, the voltage detection circuit 312 is configured to generate a signal which causes the switch cell 306 to couple the radio-frequency common node 202 to the fifth voltage source 224. By way of example, in response to detecting that the reference voltage exceeds the second specified threshold, the voltage detection circuit 312 is configured to apply a voltage to a terminal $V_c$ of switch cell 306 which activates that switch cell 306, causing the switch cell 306 to couple the radio-frequency common node 202 to the fifth voltage source 224. In some embodiments, coupling the radio-frequency common node 202 to the fifth voltage source 224 is configured to reduce the voltage potential at the radio-frequency common node 202.

In some embodiments, the fifth voltage source 224 is ground. Moreover, in some embodiments, a resistor is situated between the switch cell 306 and the fifth voltage source 224 to control a load-impedance when the switch cell 306 is activated. In some embodiments, resistor 308 is about 50 ohms.

Figure 4:
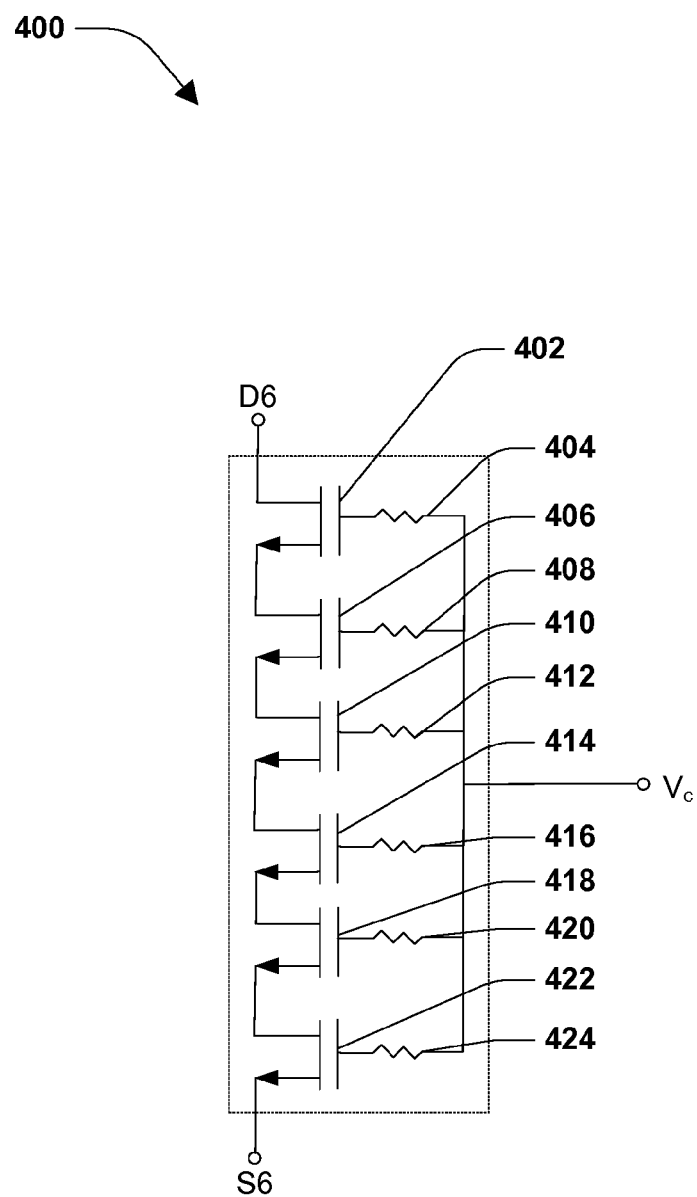
FIG. 4 is an illustration of a circuit, according to some embodiments.

In some embodiments, the switch cells 204, 206, 208, 210 and 306, have a same or similar configuration. FIG. 4 illustrates an example arrangement 400 of at least one of the switch cells 204, 206, 208, 210 or 306. The arrangement 400 comprises six transistors 402, 406, 410, 414, 418, 422 arranged in series. In some embodiments, one or more of the transistors comprise n-type MOSFETS. In some embodiments, respective transistors 402, 406, 410, 414, 418, 422 have a voltage rating of about 2.5 volts. In some embodiments, a voltage rating of the switch cell is a sum of the voltage rating of transistors 402, 406, 410, 414, 418, 422 of the switch cell. For example, where the voltage rating of respective transistors 402, 406, 410, 414, 418, 422 is about 2.5 volts, the voltage rating of the switch cell is about 15 volts (2.5*6).

Gates of respective transistors 402, 406, 410, 414, 418, 422 are coupled to a terminal $V_c$ to which a voltage is applied to activate or deactivate the transistors 402, 406, 410, 414, 418, 422. In some embodiments, one or more resistors or other electrical elements are positioned between the terminal $V_c$ and one or more transistors 402, 406, 410, 414, 418, 422. By way of example, in the arrangement 400, the gate of respective transistors 402, 406, 410, 414, 418, 422 is coupled to a resistor 404, 408, 412, 416, 420, 424.

A drain of the first transistor 402 in the arrangement 400 is coupled to a terminal D6, and a source of a last transistor 422 in the arrangement 400 is coupled to a terminal S6. The resistor 404, the resistor 408, the resistor 412, the resistor 416, the resistor 420 and the resistor 424 are respectively coupled to a point $V_c$ of the switch cell, on the opposite side of the respective resistors, from the gates of the transistors.

In some embodiments, the voltage controller is implemented using silicon on insulator (SOI) technology.

In some embodiments, the voltage controller is implemented as a stand-alone solution, such that few to no changes are necessary to the wireless communication device, other than the addition of the voltage controller.

In some embodiments, the voltage controller comprises an area smaller than other solutions such as increasing the number of transistors and resistors in the switch cells.

According to some embodiments, a voltage controller for a radio-frequency switch circuit is provided. The voltage controller comprises a voltage detection circuit configured to determine a voltage potential between an antenna and the radio-frequency switch circuit. The voltage controller also comprises a switch cell configured to reduce the voltage potential by applying the voltage potential to a voltage source when the voltage potential exceeds a specified threshold.

According to some embodiments, a method is provided which comprises determining a voltage potential between an antenna and a radio-frequency switch circuit. The method also comprises coupling the radio-frequency switch circuit to a voltage source upon the voltage potential exceeding a specified threshold.

According to some embodiments, an apparatus for a wireless communication device is provided. The apparatus comprises a radio-frequency switch circuit configured to route one or more signals between an antenna and other circuitry of the wireless communication device. The apparatus also comprises a voltage controller configured to determine a voltage potential between the radio-frequency switch circuit and the antenna to identify an antenna disconnect.

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed as to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or identical channels or the same channel.

It will be appreciated that layers, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A wireless communication device, comprising:
   an antenna port configured to receive an antenna;
   a radio-frequency switch circuit configured to route signals between the antenna and other circuitry, the radio-frequency switch circuit comprising a first switch cell comprising a first number of transistors; and
   a voltage controller, comprising:
      a voltage detection circuit configured to determine a voltage potential between the antenna port and the first switch cell;
      a second switch cell coupled between the first switch cell and a voltage source and configured to reduce the voltage potential by coupling the first switch cell to the voltage source when the voltage potential exceeds a specified threshold, the second switch cell comprising a second number of transistors equal to the first number of transistors within the first switch cell; and
      a resistor coupled between the second switch cell and the voltage source, wherein a first transistor of the second switch cell and the resistor are coupled to a common node to which no other circuitry is coupled.

2. The wireless communication device of claim 1, the voltage source being ground.

3. The wireless communication device of claim 1, comprising a reference voltage generator configured to generate a reference voltage based upon the voltage potential.

4. The wireless communication device of claim 3, the voltage detection circuit configured to determine the voltage potential based upon the reference voltage.

5. The wireless communication device of claim 3, the reference voltage generator comprising a voltage divider.

6. The wireless communication device of claim 1, the second switch cell comprising a second transistor coupled in series with the first transistor and the resistor, wherein a first gate of the first transistor and a second gate of the second transistor are coupled to a second common node, the second common node coupled to the voltage detection circuit.

7. The wireless communication device of claim 1, a voltage rating of the second switch cell matched to a voltage rating of the first switch cell.

8. The wireless communication device of claim 6, the first transistor and the second transistor comprising n-type transistors.

9. The wireless communication device of claim 6, the first transistor and the second transistor comprising n-type metal-oxide semiconductor field-effect transistors (MOSFETs).

10. The wireless communication device of claim 1, comprising a second resistor directly coupled between the first switch cell and the voltage detection circuit.

11. The wireless communication device of claim 1, the radio-frequency switch circuit comprising a third switch cell coupled to the second switch cell.

12. The wireless communication device of claim 1, the voltage controller configured to inhibit the voltage potential from exceeding the specified threshold.

13. A wireless communication device, comprising:
   an antenna port configured to receive an antenna;
   a radio-frequency switch circuit configured to route signals between the antenna and other circuitry; and
   a voltage controller, comprising:
      a voltage detection circuit coupled to a node between the antenna port and the radio-frequency switch circuit and configured to determine a voltage potential between the antenna port and the radio-frequency switch circuit;
      a switch cell configured to couple the node to a voltage source when the voltage potential exceeds a specified threshold; and
      a resistor coupled between the switch cell and the voltage source, wherein a first transistor of the switch cell and the resistor are coupled to a common node to which no other circuitry is coupled.

14. The wireless communication device of claim 13, the voltage source being ground.

15. The wireless communication device of claim 13, the specified threshold corresponding to a voltage level indicative of an antenna disconnect from the antenna port.

16. The wireless communication device of claim 13, comprising a reference voltage generator configured to generate a reference voltage based upon the voltage potential.

17. The wireless communication device of claim 16, the voltage detection circuit configured to determine the voltage potential based upon the reference voltage.

18. The wireless communication device of claim 13, the antenna port and the radio-frequency switch circuit both coupled to the voltage source when the voltage potential exceeds the specified threshold.

19. The wireless communication device of claim 13, the voltage detection circuit coupled to a gate of the first transistor.

20. A wireless communication device, comprising:

an antenna port configured to receive an antenna;

a radio-frequency switch circuit configured to route signals between the antenna and other circuitry, the radio-frequency switch circuit comprising a first switch cell; and a voltage controller, comprising:
  a voltage divider comprising a first resistor directly coupled to the antenna port;
  a voltage detection circuit directly coupled between the first resistor and a second resistor of the voltage divider, the voltage detection circuit configured to determine a voltage potential between the antenna port and the first switch cell;
  a second switch cell coupled between the first switch cell and a voltage source and configured to couple at least one of the antenna port or the first switch cell to the voltage source when the voltage potential exceeds a specified threshold to reduce the voltage potential between the antenna port and the first switch cell, a voltage rating of the second switch cell matched to a voltage rating of the first switch cell; and a third resistor that is coupled between the second switch cell and the voltage source, wherein a first transistor of the second switch cell and the third resistor are coupled to a common node to which no other circuitry is coupled.

* * * * *